(12) United States Patent
Gu

(10) Patent No.: US 10,504,984 B2
(45) Date of Patent: Dec. 10, 2019

(54) LIGHT EMITTING CIRCUIT AND DRIVING METHOD THEREOF, ELECTRONIC DEVICE, THIN FILM TRANSISTOR AND MANUFACTURE METHOD THEREOF

(71) Applicant: BOE TECHNOLOGY GROUP CO., LTD., Beijing (CN)

(72) Inventor: Pengfei Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/070,656

(22) PCT Filed: Dec. 15, 2017

(86) PCT No.: PCT/CN2017/116508
§ 371 (c)(1),
(2) Date: Jul. 17, 2018

(87) PCT Pub. No.: WO2018/205613
PCT Pub. Date: Nov. 15, 2018

(65) Prior Publication Data
US 2019/0280070 A1        Sep. 12, 2019

(30) Foreign Application Priority Data

May 11, 2017   (CN) .......................... 2017 1 0329943

(51) Int. Cl.
*H01L 27/146*        (2006.01)
*H01L 27/32*         (2006.01)
(Continued)

(52) U.S. Cl.
CPC ....... *H01L 27/3262* (2013.01); *G09G 3/3258* (2013.01); *G09G 3/3291* (2013.01);
(Continued)

(58) Field of Classification Search
CPC .. H01L 21/8232; H01L 29/1025; H01L 29/68
See application file for complete search history.

(56) References Cited

U.S. PATENT DOCUMENTS

2006/0043527 A1    3/2006  Kwak
2011/0241112 A1*  10/2011  Zuniga ................ H01L 29/1095
                                                              257/343
(Continued)

FOREIGN PATENT DOCUMENTS

CN           1719508 A      1/2006
CN         104538458 A      4/2015
(Continued)

OTHER PUBLICATIONS

International Search Report dated Mar. 14, 2018.

*Primary Examiner* — Cheung Lee
(74) *Attorney, Agent, or Firm* — Dilworth & Barrese, LLP.; Michael J. Musella, Esq.

(57) ABSTRACT

A light emitting circuit and a driving method thereof, an electronic device, a double-gate thin film transistor and a manufacture method thereof are provided. The light emitting circuit includes a double-gate thin film transistor and a light emitting component, the double-gate thin film transistor includes a first gate electrode, a second gate electrode, a first electrode and a second electrode, and where only both the first gate electrode and the second gate electrode receive turn-on signals simultaneously, the double-gate thin film transistor is turned on to drive the light emitting component.

20 Claims, 7 Drawing Sheets

(51) Int. Cl.
*G09G 3/3291* (2016.01)
*H01L 29/66* (2006.01)
*H01L 21/266* (2006.01)
*G09G 3/3258* (2016.01)
*H01L 29/786* (2006.01)
*H01L 29/78* (2006.01)

(52) U.S. Cl.
CPC ...... *H01L 21/266* (2013.01); *H01L 27/14603* (2013.01); *H01L 27/3265* (2013.01); *H01L 27/3276* (2013.01); *H01L 29/66757* (2013.01); *H01L 29/7831* (2013.01); *H01L 29/78645* (2013.01)

(56) References Cited

U.S. PATENT DOCUMENTS

2016/0365458 A1 12/2016 Shi et al.
2018/0233082 A1 8/2018 Wang et al.

FOREIGN PATENT DOCUMENTS

| CN | 104732927 A | 6/2015 |
| CN | 105572992 A | 5/2016 |
| CN | 107086227 A | 8/2017 |

* cited by examiner

LIGHT EMITTING CIRCUIT AND DRIVING METHOD THEREOF, ELECTRONIC DEVICE, THIN FILM TRANSISTOR AND MANUFACTURE METHOD THEREOF

The present application claims priority to the Chinese patent application No. 201710329943.2, filed on May 11, 2017, the entire disclosure of which is incorporated herein by reference as part of the present application.

TECHNICAL FIELD

Embodiments of the present disclosure relate to a light emitting circuit and a driving method thereof, an electronic device, a thin film transistor and a manufacture method thereof.

BACKGROUND

AMOLED (Active-matrix organic light emitting diode) is a self-luminous display. Compared with traditional liquid crystal display panels, AMOLED display panels have advantages such as faster response, higher contrast, wider viewing angle, and so on. Therefore, AMOLEDs have been used more and more widely.

SUMMARY

At least one embodiment of the present disclosure provides a light emitting circuit, comprising: a double-gate thin film transistor and a light emitting component; the double-gate thin film transistor comprises a first gate electrode, a second gate electrode, a first electrode and a second electrode, and the light emitting component comprises a first terminal and a second terminal; the first gate electrode and the second gate electrode are respectively electrically connected to different signal lines, the first electrode is electrically connected to a first power supply terminal, the second electrode is electrically connected to the first terminal of the light emitting component, and the second terminal of the light emitting component is electrically connected to a second power supply terminal; the light emitting circuit is configured to be driven, where only both the first gate electrode and the second gate electrode receive turn-on signals simultaneously, to allow the double-gate thin film transistor to be turned on.

The light emitting circuit provided by at least one embodiment of the present disclosure further comprises at least one of a first capacitor and a second capacitor; a first terminal of the first capacitor is electrically connected to the first gate electrode, and a second terminal of the first capacitor is electrically connected to the first terminal of the light emitting component; a first terminal of the second capacitor is electrically connected to the second gate electrode, and a second terminal of the second capacitor is electrically connected to the first terminal of the light emitting component.

In the light emitting circuit provided by at least one embodiment of the present disclosure, the double-gate thin film transistor is a double-top-gate thin film transistor.

At least one embodiment of the present disclosure further provides an electronic device, comprising any one of the above light emitting circuits.

The electronic device provided by at least one embodiment of the present disclosure further comprises a gate driving circuit and a data driving circuit; in the double-gate thin film transistor of the light emitting circuit, the first gate electrode is configured to receive a gate signal applied by the gate driving circuit, and the second gate electrode is configured to receive a data signal applied by the data driving circuit.

At least one embodiment of the present disclosure further provides a driving method of a light emitting circuit, comprising: applying a driving signal of a fixed voltage to the first gate electrode and applying a driving signal of a variable voltage to the second gate electrode, so as to allow the double-gate thin film transistor to be turned on to drive the light emitting component.

At least one embodiment of the present disclosure further provides a thin film transistor, comprising: an active layer, a first gate electrode, a second gate electrode, a source electrode and a drain electrode; the first gate electrode and the second gate electrode are insulated from each other, and an orthogonal projection of the first gate electrode on the active layer incompletely overlaps with an orthogonal projection of the second gate electrode on the active layer, and where the first gate electrode and the second gate electrode receive turn-on signals simultaneously, the thin film transistor is turned on.

In the thin film transistor provided by at least one embodiment of the present disclosure, the orthogonal projection of the first gate electrode on the active layer and the orthogonal projection of the second gate electrode on the active layer is between an orthogonal projection of the source electrode on the active layer and an orthogonal projection of the drain electrode on the active layer.

In the thin film transistor provided by at least one embodiment of the present disclosure, the first gate electrode and the second gate electrode are on a same side of the active layer and there is an interval between the first gate electrode and the second gate electrode; a region in the active layer corresponding to an orthogonal projection of the interval on the active layer is a conductive region.

In the thin film transistor provided by at least one embodiment of the present disclosure, the first gate electrode comprises a first branch electrode and a second branch electrode that are electrically connected to each other, and the first branch electrode, the second gate electrode and the second branch electrode are sequentially arranged side by side.

The thin film transistor provided by at least one embodiment of the present disclosure further comprises a base substrate, wherein the active layer, the first gate electrode, the second gate electrode, the source electrode and the drain electrode are on the base substrate, and the first gate electrode and the second gate electrode are on a same side of the active layer that is away from the base substrate.

At least one embodiment of the present disclosure further provides a manufacture method of a thin film transistor, comprising: forming an active layer, a first gate electrode, a second gate electrode, a source electrode and a drain electrode of the thin film transistor; the first gate electrode and the second gate electrode are insulated from each other, an orthographic projection of the first gate electrode on the active layer incompletely overlaps with an orthographic projection of the second gate electrode on the active layer, and where only the first gate electrode and the second gate electrode receive turn-on signals simultaneously, the thin film transistor is turned on.

In the manufacture method provided by at least one embodiment of the present disclosure, the orthogonal projection of the first gate electrode on the active layer and the orthogonal projection of the second gate electrode on the active layer is between an orthogonal projection of the source electrode on the active layer and an orthogonal projection of the drain electrode on the active layer The manufacture method provided by at least one embodiment of the present disclosure further comprises: providing a base substrate; the active layer is formed on the base substrate, the first gate electrode and the second gate electrode are formed on the active layer, and there is an interval between the first gate electrode and the second gate electrode; and using the first gate electrode and the second gate electrode as a mask to perform a conducting treatment on a region of the active layer corresponding to an orthogonal projection of the interval on the active layer.

In the manufacture method provided by at least one embodiment of the present disclosure, the conducting treatment comprises an ion doping treatment or a plasma treatment.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 4b is a cross-sectional view of the thin film transistor illustrated in FIG. 4a;

FIG. 5b is a cross-sectional view of the thin film transistor illustrated in FIG. 5a;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
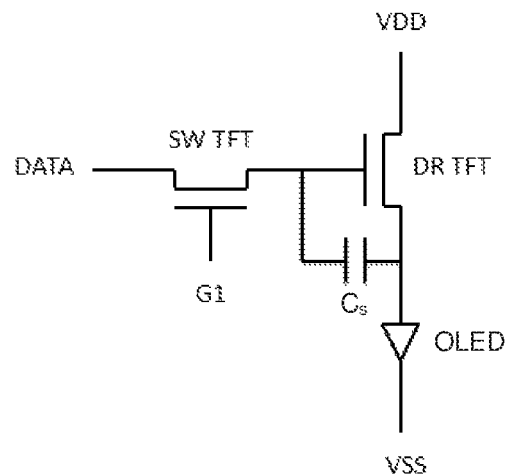
FIG. 1 illustrates a 2T1C pixel circuit.

The pixel circuit used in an AMOLED display panel is generally a 2T1C pixel circuit, which uses two TFTs (thin-film transistors) and a storage capacitor Cs to realize the basic function of driving an OLED. FIG. 1 illustrates a schematic diagram of the 2T1C pixel circuit. As illustrated in FIG. 1, the 2T1C pixel circuit comprises a switch (SW) TFT, a driving (DR) TFT and a storage capacitor Cs. For example, a gate electrode of the SW TFT is connected to a gate line (a scan line) to receive a scan signal (G1). For example, a source electrode of the SW TFT is connected to a data line to receive a data signal (DATA), a drain electrode of the SW TFT is connected to a gate electrode of the DR TFT, a source electrode of the DR TFT is connected to a first power supply terminal (VDD), and a drain electrode of the DR TFT is connected to a positive electrode of the OLED. One terminal of the storage capacitor Cs is connected to both the drain electrode of the SW TFT and the gate electrode of the DR TFT, and the other terminal of the storage capacitor Cs is connected to the drain electrode of the DR TFT and the positive electrode of the OLED. The negative electrode of the OLED is connected to a second power supply terminal (VSS), such as the ground. A driving method of the 2T1C pixel circuit is performed by controlling the brightness and darkness (grayscale) of a pixel via the two TFTs and the storage capacitor Cs. Where the scan signal G1 is applied through the gate line to turn on the SW TFT, the data voltage (DATA) input from an external circuit through the data line can charge the storage capacitor Cs via the SW TFT, and therefore the data signal is stored in the storage capacitor Cs, and the stored voltage signal controls the conduction degree of the DR TFT, and therefore the magnitude of the current flowing through the DR TFT for driving the OLED to emit light is controlled, that is, the current determines the grayscale of the light emitted by the pixel of the AMOLED.

At present, the pixel circuit used in the AMOLED display panel is the 2T1C pixel circuit, but some AMOLED display panel also uses other pixel circuit based on the 2T1C pixel circuit. Therefore, the pixel circuit needs at least two TFTs and one capacitor Cs, and the structure of the pixel circuit is still complicated.

At least one embodiment of the present disclosure provides a light emitting circuit, comprising: a double-gate thin film transistor and a light emitting component; the double-gate thin film transistor comprises a first gate electrode, a second gate electrode, a first electrode and a second electrode, and the light emitting component comprises a first terminal and a second terminal; the first gate electrode and the second gate electrode are respectively electrically connected to different signal lines, the first electrode is electrically connected to a first power supply terminal, the second electrode is electrically connected to the first terminal of the light emitting component, and the second terminal of the light emitting component is electrically connected to a second power supply terminal; the light emitting circuit is configured to be driven, where only both the first gate electrode and the second gate electrode receive turn-on signals simultaneously, to allow the double-gate thin film transistor to be turned on.

At least one embodiment of the present disclosure provides a thin film transistor, comprising: an active layer, a first gate electrode, a second gate electrode, a source electrode and a drain electrode; the first gate electrode and the second gate electrode are insulated from each other, and an orthogonal projection of the first gate electrode on the active layer incompletely overlaps with an orthogonal projection of the second gate electrode on the active layer, and where only both the first gate electrode and the second gate electrode receive turn-on signals simultaneously, the thin film transistor is turned on.

In addition, at least one embodiment of the present disclosure provides a manufacture method of a thin film transistor, comprising: forming an active layer, a first gate electrode, a second gate electrode, a source electrode and a drain electrode of the thin film transistor; the first gate electrode and the second gate electrode are insulated from each other, an orthographic projection of the first gate electrode on the active layer incompletely overlaps with an orthographic projection of the second gate electrode on the active layer, and where only both the first gate electrode and the second gate electrode receive turn-on signals simultaneously, the thin film transistor is turned on.

Hereinafter, a light emitting circuit and a driving method thereof, an electronic device, a thin film transistor and a manufacture method thereof according to embodiments of the present disclosure are described by some embodiments.

Figure 2:
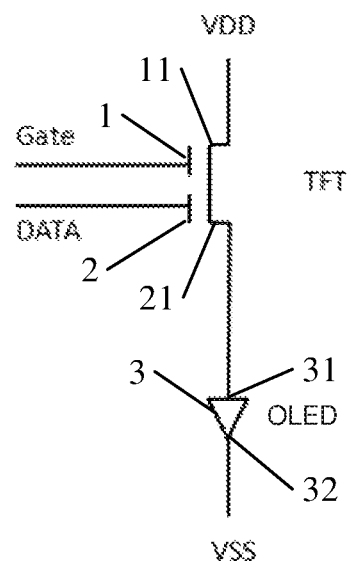
FIG. 2 illustrates a light emitting circuit provided by an embodiment of the present disclosure.

An embodiment provides a light emitting circuit, and the light emitting circuit can be applied to, for example, a display device, a light emitting device, a lighting device or the like. As illustrated in FIG. 2, the light emitting circuit comprises a double-gate thin film transistor (TFT) and a light emitting component 3 that is electrically connected to the double-gate thin film transistor (TFT). The light emitting component 3 can be, for example, a light emitting diode. For example, the light emitting component 3 is an organic light emitting diode (OLED), an inorganic light emitting diode or the like. The light emitting component 3 comprises two terminals, namely, a first terminal 31 and a second terminal 32, which are, for example, a positive terminal and a negative terminal, respectively. The light emitting component 3 is connected to other components in the circuit through the two terminals. The double-gate thin film transistor (TFT) comprises a first gate electrode 1, a second gate electrode 2, a first electrode 11 and a second electrode 21. The first gate electrode 1 and the second gate electrode 2 are respectively and electrically connected to different signal lines to receive different signals. For example, the first gate electrode 1 is connected to a gate line so as to be connected to a gate driving circuit and is configured to receive a gate signal (Gate) applied by the gate driving circuit. The second gate electrode 2 is connected to a data line so as to be connected to a data driving circuit and is configured to receive a data signal (Data) applied by the data driver circuit. In the embodiment, where only both the first gate electrode and the second gate electrode receive turn-on signals simultaneously, the double-gate thin film transistor can be turned on to drive the light emitting component.

In the embodiment, for example, the double-gate thin film transistor (TFT) can be an N-type transistor or a P-type transistor. For example, where the double-gate thin film transistor (TFT) is an N-type transistor, the first electrode 11 of the double-gate thin film transistor (TFT) is configured as a drain electrode and is configured to be electrically connected to a first power supply terminal VDD. The first power supply terminal can be configured to provide a working voltage. The second electrode 21 of the double-gate thin film transistor (TFT) is configured as a source electrode and is configured to be electrically connected to the first terminal 31 of the organic light emitting diode 3, and the second terminal 32 of the organic light emitting diode 3 is configured to be electrically connected to a second power supply terminal VSS. In the embodiment, the second terminal 32 of the organic light emitting diode 3 can be grounded.

For example, where the double-gate thin film transistor (TFT) is a P-type transistor, the first electrode 11 of the double-gate thin film transistor (TFT) is configured as a source electrode and is configured to be electrically connected to a first power supply terminal VDD, and the second electrode 21 of the double-gate thin film transistor (TFT) is configured as a drain electrode.

Hereinafter, the double-gate thin film transistor (TFT) being an N-type transistor and the light-emitting component 3 being an organic light-emitting diode are taken as an example for illustration, but the embodiments of the present disclosure are not limited in this aspect.

In addition, at least one embodiment of the present disclosure further provides an electronic device, and the electronic device comprises the above light emitting circuit. The electronic device can be any suitable device, for example, can be a display device, and can also be a light emitting device or a lighting device, such as a billboard, a floodlight or the like.

Figure 3:
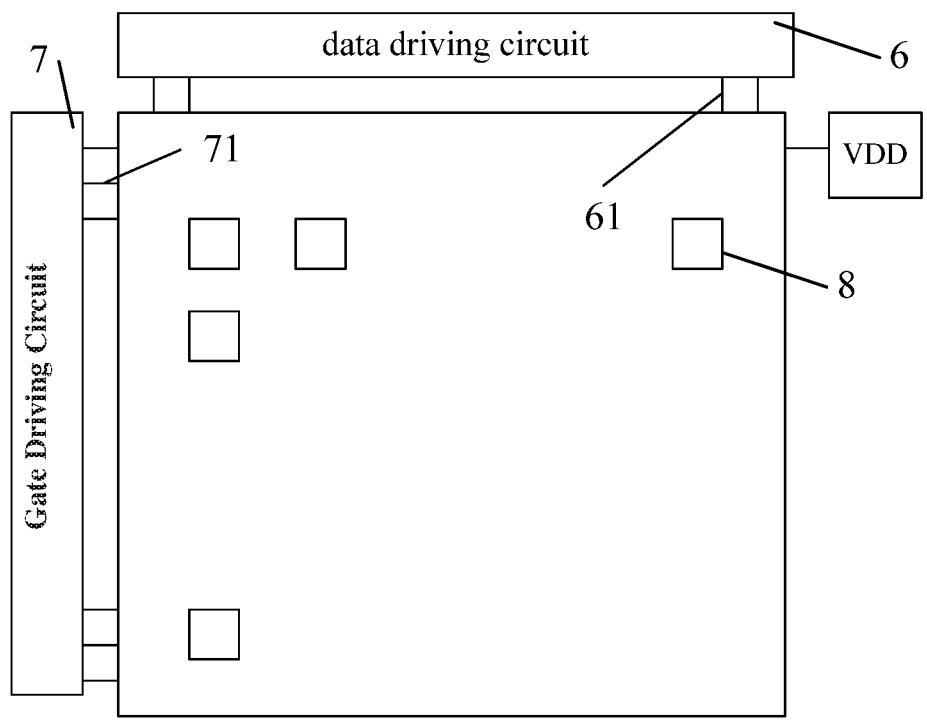
FIG. 3 illustrates an electronic device provided by an embodiment of the present disclosure.

As illustrated in FIG. 3, where the electronic device is a display device, the display device can further comprise a data driving circuit 6 and a gate driving circuit 7 for providing a data signal and a gate signal, respectively. The display device comprises a plurality of pixels 8 that are arranged in an array, the data driving circuit 6 is electrically connected to the pixels 8 through data lines 61, and the gate driving circuit 7 is electrically connected to the pixels 8 through gate lines 71. Different pixels 8 can emit light of different colors (such as red light, green light, blue light or white light), and the above light emitting circuit is used as the pixel circuit of each pixel 8 to emit light during working. The display device can further comprise a power supply terminal VDD. Where the light emitting component 3 is an OLED, the display device can be an AMOLED.

In addition, the embodiment further provides a driving method of the above light-emitting circuit and an electronic device comprising the light-emitting circuit. The driving method of the light-emitting circuit comprises: applying a driving signal of a fixed voltage to the first gate electrode 1 and applying a driving signal of a variable voltage to the second gate electrode 2, so as to allow the double-gate thin film transistor to be turned on to drive the light emitting component 3.

Hereinafter, taking the display device as an example, the exemplary driving method of the light emitting circuit and the electronic device are illustrated.

For example, in the double-gate thin film transistor of the light emitting circuit of the pixel 8, the first gate electrode 1 is configured to receive the gate signal applied by the gate driving circuit 7, and the second gate electrode 2 is configured to receive the data signal applied by the data driving circuit 6. With such a configuration, where only both the first gate electrode 1 and the second gate electrode 2 receive turn-on signals simultaneously, that is, the first gate electrode 1 and the second gate electrode 2 respectively receive the gate signal (Gate) applied by the gate driving circuit and the data signal (Data) applied by the data driving circuit simultaneously, the double-gate thin film transistor is turned on, so that the power supply voltages VDD and VSS are applied to the two terminals of the light emitting component 3 to drive the light emitting component 3 to work, for example, to emit light of a predetermined brightness. However, where either of the first gate electrode 1 and the second gate electrode 2 is in an OFF-state where being applied with a turn-off signal, the double-gate thin film transistor (TFT) is turned off.

For example, in a specific application, the first electrode 11 of the double-gate thin film transistor (TFT) is configured as a drain electrode and is configured to be electrically connected to the first power supply terminal VDD, and the first power supply terminal provides a constant voltage of 12V. The second electrode 21 of the double-gate thin film transistor (TFT) is configured as a source electrode and is electrically connected to the second power supply terminal VSS through the organic light emitting diode. The second power supply terminal is grounded and provides a voltage of 0V. The threshold voltage of the double-gate thin film transistor (TFT) is, for example, 3V. The gate signal (Gate) applied by the gate driving circuit, to which the first gate electrode 1 of the double-gate thin film transistor (TFT) is connected, is a constant voltage of 20V, so that the gate signal is an turn-on signal to allow a portion of the channel of the thin film transistor to be turned on. The data signal (Data) applied by the data driving circuit, to which the second gate electrode 2 of double-gate thin film transistor (TFT) is connected, is a grayscale signal that varies between 0V and 12 V. Where the data signal is greater than 3 V, the data signal is another turn-on signal to allow a portion of the channel of the thin film transistor to be turned on. Where both the first gate electrode and the second gate electrode receive turn-on signals simultaneously, the whole channel of the double-gate thin film transistor can be turned on, so that the double-gate thin film transistor is turned on. Moreover, where the voltage of the second gate electrode 2 varies between 0V and 12 V, the turn-on degree of the double-gate thin film transistor (TFT) can be adjusted, that is, the resistance between the source electrode and the drain electrode of the double-gate thin film transistor (TFT) can be adjusted. Therefore, by controlling the magnitude of the voltage applied to the second gate electrode 2, the effect of controlling the resistance between the source electrode and the drain electrode can be achieved, so that different electric currents can be applied to the light emitting component 3 to control the light emission brightness of the light emitting component 3; therefore, for example, the function of adjusting the grayscale in a display device can be achieved. The voltage values of the above signals can be changed according to requirements, and the embodiment of the present disclosure is not limited to these specific values.

Therefore, the AMOLED of the embodiment utilizes the light emitting circuit disclosed by the embodiment of the present disclosure to replace the commonly used 2T1C circuit, so that the structure of the circuit is simplified, and in this situation, the circuit realizes the function of two TFTs in the original 2T1C circuit by a single TFT, and the complexity and production cost of the AMOLED are reduced.

The embodiment further provides a double-gate thin film transistor (TFT) that is used in the above light emitting circuit. The double-gate thin film transistor (TFT) comprises an active layer, a first gate electrode, a second gate electrode, a source electrode and a drain electrode. The first gate electrode and the second gate electrode are insulated from each other, and the first gate electrode and the second gate electrode are configured to respectively control different portions of the active layer of the double-gate thin film transistor. For example, an orthogonal projection of the first gate electrode on the active layer incompletely overlaps with an orthogonal projection of the second gate electrode on the active layer, so that where only both the first gate electrode and the second gate electrode receive turn-on signals simultaneously, the double-gate thin film transistor is turned on to drive the light emitting component.

Figure 4A:
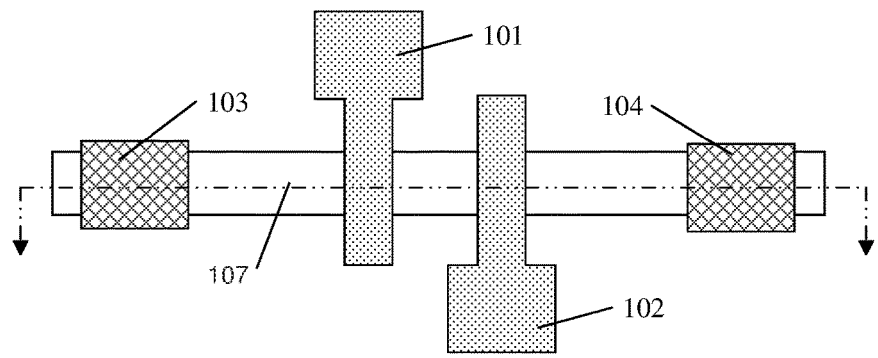
FIG. 4a is a plane view of a thin film transistor provided by an embodiment of the present disclosure.
Figure 4B:
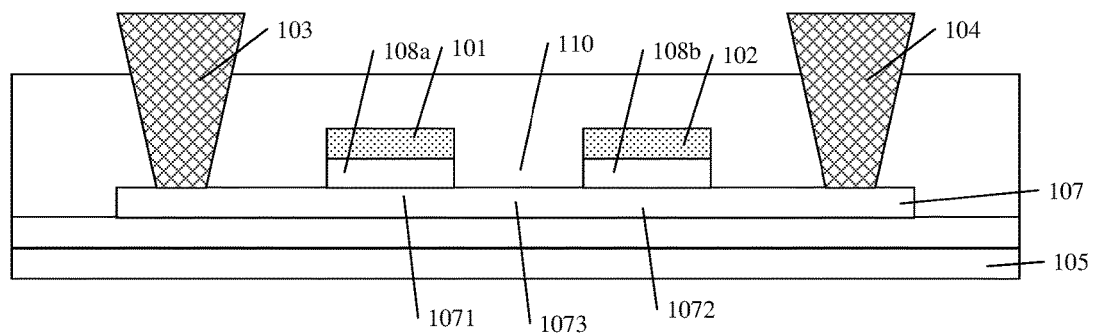

FIG. 4a is a plan view of an exemplary thin film transistor provided by the embodiment, and FIG. 4b is a sectional view of the thin film transistor illustrated in FIG. 4a.

As illustrated in FIGS. 4a and 4b, the double-gate thin film transistor in the embodiment is a double-top-gate thin film transistor. The double-top-gate thin film transistor comprises an active layer 107, a first gate electrode 101, a second gate electrode 102, a source electrode 103 and a drain electrode 104. For example, the source electrode 103 can be connected to the light emitting component, and the drain electrode 104 can be connected to the power supply terminal VDD.

For example, the first gate electrode 101 and the second gate electrode 102 are insulated from each other on a base substrate 105. As illustrated in FIGS. 4a and 4b, the first gate electrode 101 and the second gate electrode 102 are provided on the active layer 107 respectively through a first gate insulating layer 108a and a second gate insulating layer 108b and are in parallel between the source electrode 103 and the drain electrode 104. There is an interval 110 between the first gate electrode 101 and the second gate electrode 102, and a region 1073 in the active layer 107 corresponding to an orthogonal projection of the above interval 110 on the active layer 107 is a conductive region. In the thin film transistor, the portion of the active layer corresponding to the gate electrode is a channel region, and where a turn-on voltage is applied to the gate electrode, the channel region is in a turn-on state, otherwise the channel region remains in a turn-off state. In the orthogonal projection direction (a direction perpendicular to the base substrate 105), the active layer 107 comprises a first sub-channel 1071 and a second sub-channel 1072 respectively corresponding to the first gate electrode 101 and the second gate electrode 102, and is controlled respectively by the first gate electrode 101 and the second gate electrode 102, that is, where the first gate electrode 101 is applied with a turn-on signal, the first sub-channel 1071 becomes conductive, and where the second gate electrode 102 is applied with another turn-on signal, the second sub-channel 1072 becomes conductive. The first sub-channel 1071 and the second sub-channel 1072 constitute the channel of the active layer. Therefore, in the thin film transistor of the example, the first gate electrode and the second gate electrode are configured to respectively control different portions of the active layer of the thin film transistor. The above first sub-channel 1071 and the second sub-channel 1072 can be arranged side by side, or partially overlap with each other (for example, where the first gate electrode and the second gate electrode are on different sides of the active layer, that is, one is a top gate electrode and the other is a bottom gate electrode), but incompletely overlap with each other, so where only both the first sub-channel 1071 and the second sub-channel 1072 are turned on, the whole channel is turned on.

With this configuration, where only both the first gate electrode 101 and the second gate electrode 102 receive turn-on signals simultaneously, the double-gate thin film transistor is turned on, and the source electrode 103 and the drain electrode 104 are electrically connected with each other. Where either of the first gate electrode 101 and the second gate electrode 102 is in an off-state, the double-gate thin film transistor TFT is turned off, and the source electrode 103 and the drain electrode 104 are insulated from each other.

Figure 5A:
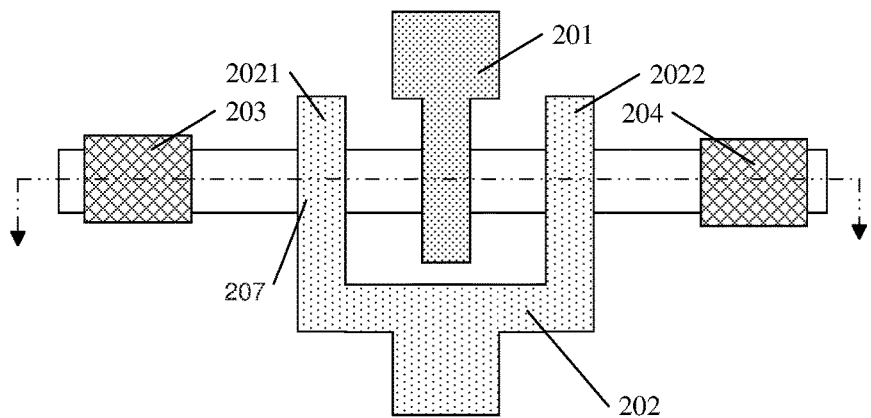
FIG. 5a is a plane view of a thin film transistor provided by another embodiment of the present disclosure.
Figure 5B:
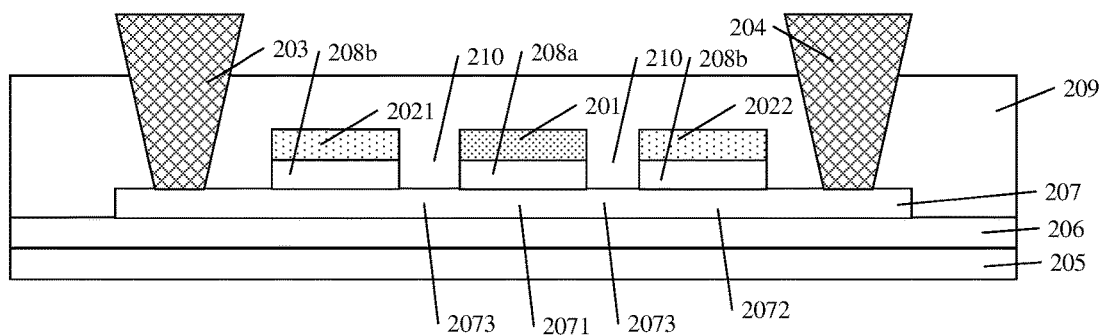

FIG. 5a is a plan view of another exemplary thin film transistor provided by the embodiment, and FIG. 5b is a sectional view of the thin film transistor illustrated in FIG. 5a.

The thin film transistor in this example is also a double-top-gate thin film transistor, and the double-top-gate thin film transistor comprises an active layer 207, a first gate electrode 201, a second gate electrode 202, a source electrode 203 and a drain electrode 204. The source electrode 203 can be connected to a light emitting component, and the drain electrode 204 can be connected to a power supply terminal VDD.

For example, the first gate electrode 201 and the second gate electrode 202 are insulated from each other. As illustrated in FIGS. 5a and 5b, the first gate electrode 201 and the second gate electrode 202 are on the active layer 207 respectively through a first gate insulating layer 208a and a second gate insulating layer 208b, and are in parallel between the source electrode 203 and the drain electrode 204. Different from the above example, the second gate electrode 202 of the thin film transistor of this example is in a "U" shape, comprising a first branch electrode 2021 and a second branch electrode 2011 that are electrically connected with each other, and the first branch electrode 2021, the first gate electrode 201 and the second branch electrode 2022 are sequentially arranged side by side on the active layer 207. There are intervals 210 between the first gate electrode 201 and the second gate electrode 202, and regions 2073 in the active layer 207 corresponding to orthogonal projections of the above intervals 210 on the active layer are conductive regions. Similarly, the above active layer 207 comprises a first sub-channel 2071 and a second sub-channel 2072 respectively corresponding to the first gate electrode 201 and the second gate electrodes 202 and controlled respectively by the first gate electrode 201 and the second gate electrode 202, that is, where the first gate electrode 201 is applied with a turn-on signal, the first sub-channel 2071 becomes conductive, and where the second gate electrode 202 is applied with another turn-on signal, the second sub-channel 2072 becomes conductive. Therefore, in the thin film transistor of the example, the first gate electrode and the second gate electrode are configured to respectively control different portions of the active layer of the thin film transistor. It should be noted that the shapes of the first gate electrode 201 and the second gate electrode 202 of the thin film transistor in this example can also be any shape, and the present disclosure is not limited in this aspect.

The above configuration can realize that where only both the first gate electrode 201 and the second gate electrode 202 receive turn-on signals simultaneously, the double-gate thin film transistor is turned on, and the source electrode 203 and the drain electrode 204 are electrically connected with each other. Where either of the first gate electrode 201 and the second gate electrode 202 is in an off-state, the double-gate thin film transistor TFT is turned off, and the source electrode 203 and the drain electrode 204 are insulated from each other.

It should be noted that the above descriptions only focus on the main structures of the thin film transistor in the embodiment. Of course, the thin film transistor can also comprise other structures. For example, the thin film transistor in the embodiment can further comprise a base substrate, and the active layer, the first gate electrode, the second gate electrode, the source electrode and the drain electrode are on the base substrate. The base substrate can be a glass substrate, a plastic substrate or the like. The active layer can be made of amorphous silicon, polysilicon or oxide semiconductor material, and other portions of the active layer except for the channel region (comprising regions corresponding to the intervals between the first gate electrode and the second gate electrode) are processed to be conductive regions. The gate electrode, the source electrode and the drain electrode can be made of, for example, a conductive material such as a metal. The metal can be aluminum, aluminum alloy, copper, copper alloy or the like. The gate insulating layer can be made of a material such as silicon oxide, silicon nitride, silicon oxynitride or the like. The thin film transistor in the embodiment can further comprise a buffer layer, an insulating layer and so on that are arranged on the base substrate, which will not be described herein.

It should be noted that the double-gate thin film transistors in the examples illustrated in the above figures are all double-top-gate thin film transistors, but in other embodiments, the thin film transistors can also be double-bottom-gate thin film transistors, or can also be thin film transistors with one top gate electrode and one bottom gate electrode, in these situations, the first gate electrode and the second gate electrode should also be insulated from each other, and the first gate electrode and the second gate electrode are above or below the active layer. In these structures, the first gate electrode and the second gate electrode are configured to respectively control different portions of the active layer of the thin film transistor. For example, an orthogonal projection of the first gate electrode on the active layer incompletely overlaps with an orthogonal projection of the second gate electrode on the active layer, and therefore where only both the first gate electrode and the second gate electrode receive turn-on signals simultaneously, the double-gate thin film transistor is turned on. Where either one of the first gate electrode and the second gate electrode is in an off-state where a turn-off signal is applied, the double-gate thin film transistor is turned off. In order to allow the first gate electrode and the second gate electrode to respectively control different portions of the active layer of the thin film transistor and allow the double-gate thin film transistor to be turned on where only both the first gate electrode and the second gate electrode receive turn-on signals simultaneously, for example, the orthogonal projection of the first gate electrode on the active layer and the orthogonal projection of the second gate electrode on the active layer is between an orthogonal projection of the source electrode on the active layer and an orthogonal projection of the drain electrode on the active layer, and the orthogonal projection of the first gate electrode on the active layer at least incompletely overlaps with, that is, does not overlap with or incompletely overlaps with, the orthogonal projection of the second gate electrode on the active layer in a direction from the source electrode to the drain electrode, so that the active layer comprises different sub-channel regions respectively corresponding to the first gate electrode and the second gate electrode and respectively controlled by the first gate electrode and the second gate electrode, and these different sub-channel regions constitute the channel region of the active layer.

Figure 6:
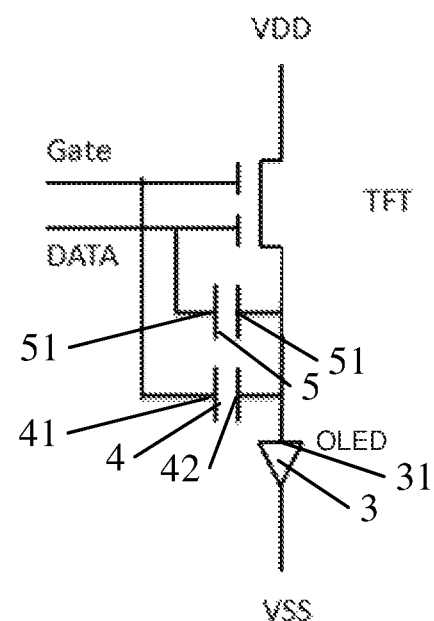
FIG. 6 is a light emitting circuit provided by another embodiment of the present disclosure.

In the embodiment of the present disclosure, the light emitting circuit further comprises at least one capacitor in addition to the same structure illustrated in the above embodiment of FIG. 2. For example, as illustrated in FIG. 6, the light emitting circuit according to the embodiment further comprises a first capacitor 4 and a second capacitor 5. A first terminal 41 of the first capacitor 4 is electrically connected to the first gate electrode 1, and a second terminal 42 of the first capacitor 4 is electrically connected to the first terminal of the light emitting element 3. A first terminal 51 of the second capacitor 5 is electrically connected to the second gate electrode 2, and a second terminal 52 of the second capacitor 5 is electrically connected to the first terminal 31 of the light emitting element 3.

The double-gate thin film transistor of the light emitting circuit provided by this embodiment can adopt any of the double-gate thin film transistors in the above embodiments.

The first capacitor 4 and the second capacitor 5 in the light emitting circuit provided by this embodiment can play a role of maintaining electrical signals. Where the gate signal (Gate) applied by the gate driving circuit and the data signal (Data) applied by the driving circuit are not continuous signals and are interrupted, the electrical signals applied to the first gate electrode 1 and the second gate electrode 2 can be maintained respectively by the first capacitor 4 and the second capacitor 5 that are respectively connected to the first gate electrode 1 and the second gate electrode 2.

It should be noted that, where the gate signal (Gate) applied by the gate driving circuit and the data signal (Data) applied by the driving circuit are continuous, the first capacitor 4 and the second capacitor 5 may not be provided, or one or both of the first capacitor 4 and the second capacitor 5 may be selectively provided according to actual situations, such as whether the gate signal (Gate) applied by the circuit and the data signal (Data) applied by the data driving circuit are continuous signals.

In addition, the embodiment further provides a driving method of the above light emitting circuit. The method comprises: applying a driving signal of a fixed voltage to the first gate electrode 1 and applying a driving signal of a variable voltage to the second gate electrode 2, so as to allow the double-gate thin film transistor to be turned on to drive the light emitting component 3.

In the method of the embodiment, because the driving signal applied on the first gate electrode 1 is a fixed voltage signal, the first gate electrode 1 may not be connected to the first capacitor 4. Because the driving signal applied on the second gate electrode 2 is a variable voltage signal, it can be determined whether the second gate electrode 2 is connected to a capacitor according to the signal characteristics. For example, where there may be an interruption in the variable voltage signal, the second capacitor 5 can be arranged, and where the variable voltage signal is continuous, the second capacitor 5 may not be provided.

For example, the light emitting circuit provided in the embodiment can also be applied to the electronic device illustrated in FIG. 3, and the driving method of the embodiment is used to drive the circuit. In the electronic device, because the driving signal applied to the second gate electrode 2 is a variable voltage signal, the purpose of adjusting the turn-on degree of the double-gate thin film transistor TFT can be achieved, that is, the effect of controlling the resistance between the source electrode and drain electrode can be achieved by controlling the voltage of the second gate electrode 2. Where the light emitting circuit or the electronic device is applied to the AMOLED, the function of adjusting the grayscale of the AMOLED can be realized, so that the pixel 8 can emit the desired light continuously and stably.

The double-gate transistor according to the embodiment can also adopt, for example, the exemplary structures illustrated in FIGS. 4a and 4b or FIGS. 5a and 5b. For example, the double-gate thin film transistor is a double-top-gate thin film transistor, a dual-bottom-gate thin film transistor, or a thin film transistor with one top gate electrode and one bottom gate electrode. In these situations, the first gate electrode and the second gate electrode are also insulated from each other, and the first gate electrode and the second gate electrode are above or below the active layer. The first gate electrode and the second gate electrode respectively control different portions of the active layer of the thin film transistor, and where only both the first gate electrode and the second gate electrode receive turn-on signals simultaneously, the double-gate thin film transistor is turned on, and where either of the first gate electrode and the second gate electrode is in an off-state where a turn-off signal is applied, the double-gate thin film transistor is turned off.

For the example illustrated in FIGS. 4a and 4b or FIGS. 5a and 5b, in order to realize the first capacitor 4 and/or the second capacitor 5, a capacitor electrode connected to the first gate electrode 101/201 and a capacitor electrode connected to the second gate electrode 102/202 can be formed.

The light-emitting circuit in other embodiments of the present disclosure can comprise other circuit components in addition to the above double-gate TFT, for example, comprise a compensation circuit for compensating the threshold voltage drift of the double-gate TFT. The embodiment of the present disclosure is not limited to the case of only using the above double-gate TFT to drive the light emitting component.

At least one embodiment of the present disclosure provides a manufacture method of the above double-gate thin film transistor. Hereinafter, the double-gate thin film transistor illustrated in FIGS. 5a and 5b is taken as an example to illustrate, but the embodiment of the present disclosure is not limited to this specific situation.

FIGS. 7a-7g are flow diagrams of a manufacture method of a thin film transistor provided by the embodiment. As illustrated in FIGS. 7a-7g, the method comprises: forming an active layer 207, a first gate electrode 201, a second gate electrode 202, a source electrode 203 and a drain electrode 204 of the thin film transistor, respectively. The first gate electrode 201 and the second gate electrode 202 are insulated from each other, and the first gate electrode 201 and the second gate electrode 202 are configured to respectively control different portions of the active layer of the thin film transistor during working. For example, an orthographic projection of the first gate electrode 201 on the active layer 207 incompletely overlaps with an orthographic projection of the second gate electrode 202 on the active layer 207, so where only both the first gate electrode 201 and the second gate electrode 202 receive turn-on signals simultaneously, the double-gate thin film transistor is turned on.

For example, in an example, the orthographic projection of the first gate electrode 201 on the active layer 207 and the orthographic projection of the second gate electrode 202 on the active layer 207 is between an orthogonal projection of the source electrode 203 on the active layer 207 and an orthogonal projection of the drain electrode 204 on the active layer 207, and at least incompletely overlaps with, that is, does not overlap with or incompletely overlaps with, each other in a direction from the source electrode 203 to the drain electrode 204.

Figure 7A:
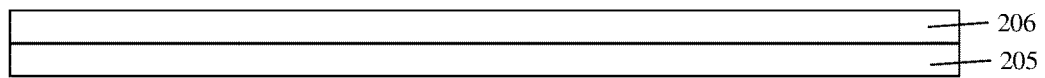
FIGS. 7a-7g are flow diagrams of a manufacture method of a thin film transistor provided by an embodiment of the present disclosure.

For example, as illustrated in FIG. 7a, a buffer layer 206 is first deposited on a base substrate 205. In the embodiment, the buffer layer 206 is deposited on the base substrate 205 by, for example, chemical vapor deposition (CVD) such as plasma enhanced chemical vapor deposition (PECVD). The buffer layer 206 can be, for example, a SiOx film, a SiNx film or a composite film of SiOx and SiNx. The base substrate 205 can be, for example, a glass substrate, a plastic substrate or the like.

Figure 7B:
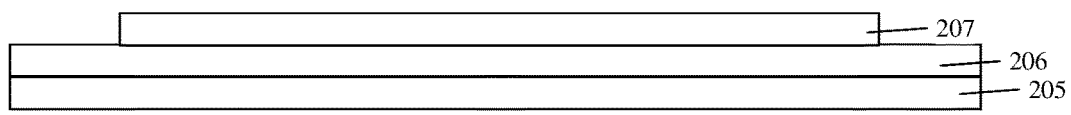

For example, as illustrated in FIG. 7b, after the buffer layer 206 is deposited, an active layer 207 is further formed on the buffer layer 206 by a sputtering method. The active layer 207 can be an amorphous silicon layer, a polysilicon layer, an oxide semiconductor layer or the like, but it should be noted that the active layer is not limited to the above materials. In the embodiment, the active layer 207 can also be made of the material of indium gallium zinc oxide. The indium gallium indium oxide is a material with a high carrier mobility, which can greatly increase the charge and discharge rate to the pixel electrode by the thin film transistor and realize faster refresh rate. After an active layer film is formed, the active layer film is patterned by a patterning process such as a photolithography process to form the final active layer 207. According to requirements, the active layer may also be formed directly on the base substrate 205 without forming the buffer layer.

For example, the main process of the photolithography process is: firstly, a layer of photoresist is coated on the surface of the film to be processed, and ultraviolet light is used to irradiate the photoresist layer through a mask to trigger the photoresist in the exposed area to react chemically. Then, the photoresist in the exposed area or unexposed area is removed (the former is related to positive photoresist while the latter is related to negative photoresist) by a development technique, so that the pattern in the mask is reproduced to the photoresist film, and the pattern is finally transferred to the film to be processed by an etching technique.

Figure 7C:
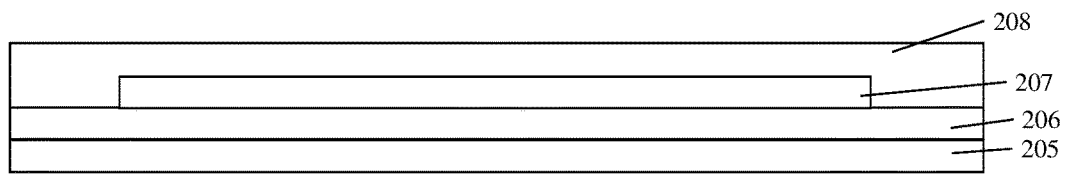

For example, as illustrated in FIG. 7c, after the active layer 207 is formed, a gate insulating layer 208 (GI layer) is formed on the active layer 207 by chemical vapor deposition (CVD), such as plasma enhanced chemical vapor deposition (PECVD). For example, the gate insulating layer 208 can be made of a material of $SiO_2$, SiNx or a composite material of $SiO_2$, SiNx.

Figure 7D:
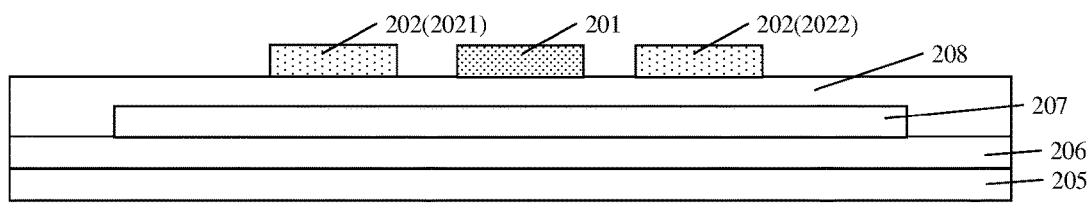

For example, as illustrated in FIG. 7d, after the gate insulating layer 208 is formed, a gate electrode film is deposited on the gate insulating layer 208 by a sputtering method. A material of the gate electrode film can be a metal material such as copper, copper alloy, aluminum, aluminum alloy or the like. Then, the gate electrode film is patterned by a photolithography process, and in this embodiment, for example, a wet etching process is performed, that is, a specific chemical solution is used to etch unnecessary portions of the gate electrode film, and the patterned first gate electrode 201 and second gate electrode 202 that are spaced apart from each other are finally obtained, and the second gate electrode comprises a first branch electrode and a second branch electrode that are electrically connected with each other. In the embodiment, the first gate electrode 201 and the second gate electrode 202 can be formed simultaneously.

Figure 7E:
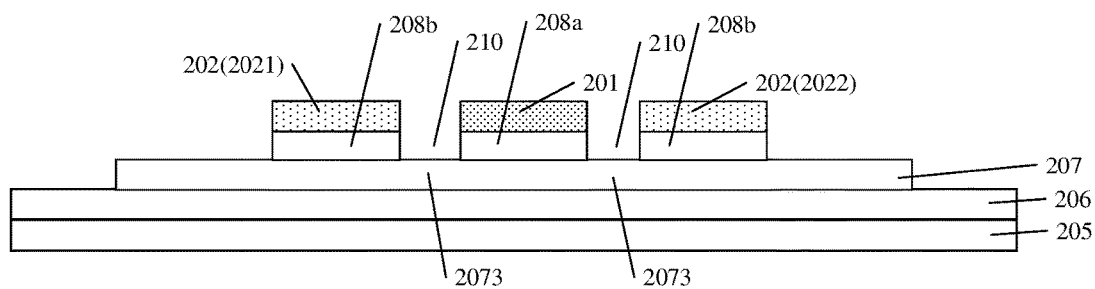

For example, as illustrated in FIG. 7e, after the first gate electrode 201 and the second gate electrode 202 are formed, the first gate electrode 201 and the second gate electrode 202 are used as a mask to perform a dry etching process on the gate insulating layer 208 to form a first gate insulating layer 208a and a second gate insulating layer 208b.

For example, after the first gate insulating layer 208a and the second gate insulating layer 208b are formed, the active layer 207 is partially exposed, and the first gate electrode 201 and the second gate electrode 202 are used as a mask to perform a conducting treatment on the exposed positions of the active layer 207 comprising the portions corresponding to intervals 110 between the first gate electrode 201 and the second gate electrode 202 to increase the conductivity of these regions, so as to form conductive regions 2073. For example, the conducting treatment can be an ion doping treatment, and can also be a plasma treatment. For example, in the embodiment, the plasma treatment can be performed on the active layer 207 by gas plasma of such as $NH_4$, He, Ar or the like to form the conductive regions 2073.

In other embodiments, for example, where the active layer is made of polysilicon, an ion doping treatment, such as a heavy doping treatment or the like, can be performed to form the conductive regions 2073. For example, where the active layer is made of amorphous silicon, a hydrogenation treatment can be performed to form the conductive regions 2073.

Figure 7F:
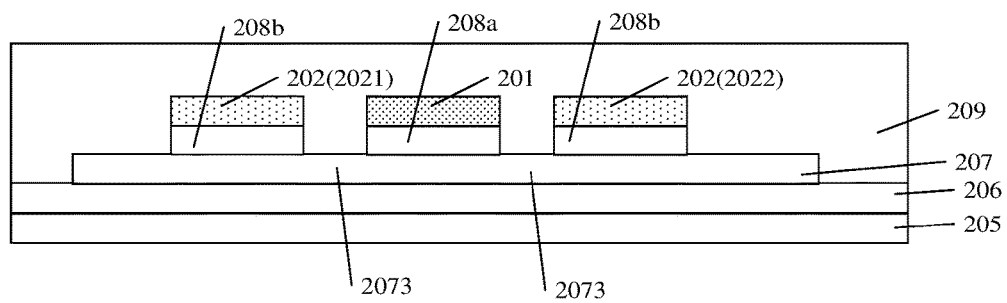

For example, as illustrated in FIG. 7f, after the conducting treatment is performed on the active layer 207, an insulating layer (a passivation layer) 209 is formed by chemical vapor deposition (CVD) on the exposed portions of the gate electrodes 201 and 202 and the active layer 207. The insulating layer 209 can be made of, for example, $SiO_2$, SiNx, or a composite material of $SiO_2$ and SiNx to protect the thin film transistor.

Figure 7G:
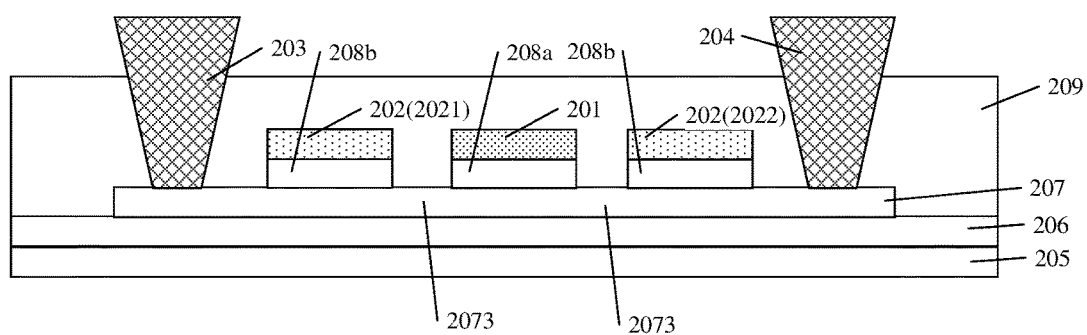

For example, as illustrated in FIG. 7g, a photolithography process and a dry etching process are performed on the insulating layer 209 to form through holes exposing the active layer 207 at positions corresponding to two sides of the gate electrodes 201 and 202, and then a source-drain electrode material is deposited in the through holes to form a source-drain electrode layer. Finally, the source-drain electrode layer is patterned by a photolithography process to form a source electrode 203 and a drain electrode 204. The source electrode 203 can be connected to a light emitting component and the drain electrode 204 can be connected to a power supply terminal. For example, a light emitting component such as an organic light emitting diode can be formed on an upper layer of the thin film transistor, and the organic light emitting diode can be of various types such as a top emission type, a bottom emission type, a double emission type or the like.

In another embodiment of the present disclosure, if the thickness of the gate insulating layer 208 does not affect the subsequent conducting treatment (for example, ion injection), the gate insulating layer 208 may not be etched after the first gate electrode and the second gate electrode are formed; alternatively, the gate insulating layer 208 is only partially etched. Correspondingly, in the subsequent formation of through holes exposing the active layer in the embodiment, the remained gate insulating layer 208 needs to be further etched.

In the thin film transistor provided by the embodiment, the first gate electrode 201 and the second gate electrode 202 are configured to respectively control different portions of the active layer of the thin film transistor, and where only both the first gate electrode 201 and the second gate electrode 202 respectively receive turn-on signals simultaneously, the thin film transistor is turned on, and where either of the first gate electrode and the second gate electrode is in an off-state, the thin film transistor is turned off.

Other types of double-gate thin film transistors can be manufactured by a similar method, for example, allowing the orthogonal projection of the first gate electrode on the active layer and the orthogonal projection of the second gate electrode on the active layer to be between the orthogonal projection of the source electrode on the active layer and the orthogonal projection of the drain electrode on the active layer, and the orthogonal projection of the first gate electrode on the active layer to at least incompletely overlap with, that is, not overlap with or incompletely overlap with, the orthogonal projection of the second gate electrode on the active layer in a direction from the source electrode to the drain electrode, so that the active layer comprises different sub-channel regions respectively corresponding to the first gate electrode and the second gate electrode and respectively controlled by the first gate electrode and the second gate electrode, and these different sub-channel regions constitute the channel region of the active layer.

The light emitting circuit, the electronic device, the double-gate thin film transistor and the manufacture method thereof provided by at least one embodiment of the present disclosure have at least one of the following beneficial effects:

(1) At least one embodiment of the present disclosure provides a double-gate thin film transistor, which can realize that where only two gate electrodes of the double-gate thin film transistor receive an turn-on signal simultaneously, the double-gate thin film transistor is turned on; and where either one of the two gate electrodes does not receive a turn-on signal, the double-gate thin film transistor is turned off.

(2) At least one embodiment of the present disclosure provides a light emitting circuit, the light emitting circuit comprises a double-gate thin film transistor to simplify the 2T1C pixel circuit, that is, the function of two TFTs in the 2T1C circuit is realized by one TFT, and the circuit structure is simplified and costs are reduced.

(3) At least one embodiment of the present disclosure provides a light emitting circuit, the circuit can further comprise a capacitor, and the capacitor can play a role of maintaining an electrical signal.

In addition, the following several statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or an area may be enlarged or reduced, that is, the drawings are not drawn according to actual scale.

(3) In case of no conflict, features in one embodiment or in different embodiments can be combined to obtain a new embodiment.

The above descriptions are merely specific embodiments of the present disclosure, and the protection scope of the present disclosure is not limited thereto. Those skilled in the art can easily conceive changes or replacements within the technical scope of the present disclosure, and the changes or replacements are all within the protection scope of the present disclosure. Therefore, the protection scope of the present disclosure shall be subject to the protection scope of the claims.

What is claimed is:

1. A light emitting circuit, comprising: a double-gate thin film transistor and a light emitting component,
   wherein the double-gate thin film transistor comprises a first gate electrode, a second gate electrode, a first electrode and a second electrode, and the light emitting component comprises a first terminal and a second terminal;
   the first gate electrode and the second gate electrode are respectively electrically connected to different signal lines, the first electrode is electrically connected to a first power supply terminal, the second electrode is electrically connected to the first terminal of the light emitting component, and the second terminal of the light emitting component is electrically connected to a second power supply terminal; the light emitting circuit is configured to be driven, where only both the first gate electrode and the second gate electrode receive turn-on signals simultaneously, to allow the double-gate thin film transistor to be turned on.

2. The light emitting circuit according to claim 1, further comprising at least one of a first capacitor and a second capacitor,
   wherein a first terminal of the first capacitor is electrically connected to the first gate electrode, and a second terminal of the first capacitor is electrically connected to the first terminal of the light emitting component; and
   a first terminal of the second capacitor is electrically connected to the second gate electrode, and a second terminal of the second capacitor is electrically connected to the first terminal of the light emitting component.

3. The light emitting circuit according to claim 2, wherein the double-gate thin film transistor is a double-top-gate thin film transistor.

4. The light emitting circuit according to claim 1, wherein the double-gate thin film transistor is a double-top-gate thin film transistor.

5. An electronic device, comprising the light emitting circuit according to claim 1.

6. The electronic device according to claim 5, further comprising a gate driving circuit and a data driving circuit,
   wherein in the double-gate thin film transistor of the light omitting circuit, the first gate electrode is configured to receive a gate signal applied by the gate driving circuit, and the second gate electrode is configured to receive a data signal applied by the data driving circuit.

7. A driving method of a light emitting circuit according to claim 1, comprising:
   applying a driving signal of a fixed voltage to the first gate electrode and applying a driving signal of a variable voltage to the second gate electrode, so as to allow the double-gate thin film transistor to be turned on to drive the light emitting component.

8. A thin film transistor, comprising: an active layer, a first gate electrode, a second gate electrode, a source electrode and a drain electrode,
   wherein the first gate electrode and the second gate electrode are insulated from each other, and an orthogonal projection of the first gate electrode on the active layer incompletely overlaps with an orthogonal projection of the second gate electrode on the active layer, and where the first gate electrode and the second gate electrode receive turn-on signals simultaneously, the thin film transistor is turned on.

9. The thin film transistor according to claim 8, wherein the orthogonal projection of the first gate electrode on the active layer and the orthogonal projection of the second gate electrode on the active layer is between an orthogonal projection of the source electrode on the active layer and an orthogonal projection of the drain electrode on the active layer.

10. The thin film transistor according to claim 9, wherein the first gate electrode and the second gate electrode are on a same side of the active layer and there is an interval between the first gate electrode and the second gate electrode;

a region in the active layer corresponding to an orthogonal projection of the interval on the active layer is a conductive region.

11. The thin film transistor according to claim 10, wherein the first gate electrode comprises a first branch electrode and a second branch electrode that are electrically connected to each other, and the first branch electrode, the second gate electrode and the second branch electrode are sequentially arranged side by side.

12. The thin film transistor according to claim 10, further comprising a base substrate,
wherein the active layer, the first gate electrode, the second gate electrode, the source electrode and the drain electrode are on the base substrate, and the first gate electrode and the second gate electrode are on a same side of the active layer that is away from the base substrate.

13. The thin film transistor according to claim 9, wherein the first gate electrode comprises a first branch electrode and a second branch electrode that are electrically connected to each other, and the first branch electrode, the second gate electrode and the second branch electrode are sequentially arranged side by side.

14. The thin film transistor according to claim 9, further comprising a base substrate,
wherein the active layer, the first gate electrode, the second gate electrode, the source electrode and the drain electrode are on the base substrate, and the first gate electrode and the second gate electrode are on a same side of the active layer that is away from the base substrate.

15. A manufacture method of a thin film transistor, comprising:
forming an active layer, a first gate electrode, a second gate electrode, a source electrode and a drain electrode of the thin film transistor;
wherein the first gate electrode and the second gate electrode are insulated from each other, an orthographic projection of the first gate electrode on the active layer incompletely overlaps with an orthographic projection of the second gate electrode on the active layer, and where only the first gate electrode and the second gate electrode receive turn-on signals simultaneously, the thin film transistor is turned on.

16. The manufacture method according to claim 15, wherein the orthogonal projection of the first gate electrode on the active layer and the orthogonal projection of the second gate electrode on the active layer is between an orthogonal projection of the source electrode on the active layer and an orthogonal projection of the drain electrode on the active layer.

17. The manufacture method according to claim 16, further comprising:
providing a base substrate,
wherein the active layer is formed on the base substrate, the first gate electrode and the second gate electrode are formed on the active layer, and there is an interval between the first gate electrode and the second gate electrode; and
using the first gate electrode and the second gate electrode as a mask to perform a conducting treatment on a region of the active layer corresponding to an orthogonal projection of the interval on the active layer.

18. The manufacture method according to claim 17, wherein the conducting treatment comprises an ion doping treatment or a plasma treatment.

19. The manufacture method according to claim 15, further comprising:
providing a base substrate,
wherein the active layer is formed on the base substrate, the first gate electrode and the second gate electrode are formed on the active layer, and there is an interval between the first gate electrode and the second gate electrode; and
using the first gate electrode and the second gate electrode as a mask to perform a conducting treatment on a region of the active layer corresponding to an orthogonal projection of the interval on the active layer.

20. The manufacture method according to claim 19, wherein the conducting treatment comprises an ion doping treatment or a plasma treatment.

* * * * *